United States Patent
Ramachandran et al.

(10) Patent No.: US 11,476,097 B2
(45) Date of Patent: Oct. 18, 2022

(54) COMMON ELECTROSTATIC CHUCK FOR DIFFERING SUBSTRATES

(71) Applicant: Applied Materials, Inc., Santa Clara, CA (US)

(72) Inventors: Vinodh Ramachandran, Singapore (SG); Ananthkrishna Jupudi, Singapore (SG); Sarath Babu, Singapore (SG)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 17/012,275

(22) Filed: Sep. 4, 2020

(65) Prior Publication Data
US 2021/0074523 A1    Mar. 11, 2021

Related U.S. Application Data

(60) Provisional application No. 62/896,712, filed on Sep. 6, 2019.

(51) Int. Cl.
| | | |
|---|---|---|
| *H01L 21/683* | (2006.01) | |
| *H01J 37/32* | (2006.01) | |
| *H02N 13/00* | (2006.01) | |

(52) U.S. Cl.
CPC .... *H01J 37/32697* (2013.01); *H01L 21/6833* (2013.01); *H02N 13/00* (2013.01); *H01L 21/683* (2013.01); *H01L 21/6831* (2013.01)

(58) Field of Classification Search
CPC ............... H01L 21/683; H01L 21/6833; H01L 21/6831; H01L 21/67253; H01L 21/67069; H01L 21/68785; H01L 21/3065; H01L 21/687; H02N 13/00

USPC .......................................................... 361/234
See application file for complete search history.

(56) References Cited

U.S. PATENT DOCUMENTS

| | | |
|---|---|---|
| 5,812,361 A | 9/1998 | Jones et al. |
| 6,361,645 B1 | 3/2002 | Schoepp et al. |
| 2003/0053283 A1 | 3/2003 | Loo et al. |
| 2011/0111601 A1* | 5/2011 | Okita ................ H01L 21/67069 438/716 |
| 2013/0230971 A1 | 9/2013 | Geerpuram et al. |
| 2015/0061237 A1 | 3/2015 | Sun et al. |
| 2015/0303092 A1* | 10/2015 | Kawabata .............. H02N 13/00 361/234 |

(Continued)

FOREIGN PATENT DOCUMENTS

| | | |
|---|---|---|
| JP | 2016032096 A | 3/2016 |
| JP | 2018133502 A | 8/2018 |

OTHER PUBLICATIONS

PCT International Search Report and Written Opinion in PCT/US2020/049332 dated Dec. 15, 2020, 10 pages.

*Primary Examiner* — Danny Nguyen
(74) *Attorney, Agent, or Firm* — Servilla Whitney LLC

(57) ABSTRACT

An apparatus, methods and controllers for electrostatically chucking varied substrate materials are disclosed. Some embodiments of the disclosure provide electrostatic chucks with variable polarity and/or voltage. Some embodiments of the disclosure provide electrostatic chucks able to operate as monopolar and bipolar electrostatic chucks. Some embodiments of the disclosure provide bipolar electrostatic chucks able to compensate for substrate bias and produce approximately equal chucking force at different electrodes.

18 Claims, 5 Drawing Sheets

(56) References Cited

U.S. PATENT DOCUMENTS

2016/0336185 A1* 11/2016 Ishiguro .............. H01L 21/6831
2020/0234931 A1* 7/2020 Tamamushi ...... H01J 37/32651

* cited by examiner

COMMON ELECTROSTATIC CHUCK FOR DIFFERING SUBSTRATES

CROSS-REFERENCE TO RELATED APPLICATIONS

This application claims priority to U.S. Provisional Application No. 62/896,712, filed Sep. 6, 2019, the entire disclosure of which is hereby incorporated by reference herein.

TECHNICAL FIELD

Embodiments of the present disclosure generally relate to apparatus, methods and controllers for electrostatically chucking substrates. Some embodiments of the disclosure allow for the chucking of differing substrate materials without modification to the electrostatic chuck.

BACKGROUND

Different substrate types have different properties that require the use of more than one type of electrostatic chuck for support during substrate processing. Existing electrostatic chucks (echucks) are limited to certain types of substrate and are ineffective or incompatible with other substrate types.

Existing echucks are uniquely either bipolar or monopolar. It can be a challenge to chuck packaging substrates with current echucks as the unique properties of the substrate may require monopolar or bipolar chucking methods. In some cases a combination of chucking methods can be used to de-chuck substrates.

Accordingly, there is a need for echucks which can operate as both bipolar and monopolar echucks.

SUMMARY

One or more embodiments of the disclosure are directed to an electrostatic chuck comprising a first electrode powered by a first power supply with a first power, a second electrode powered by a second power supply with a second power and a controller connected to the first power supply and the second power supply. The first power has a first voltage and a positive or negative polarity with reference to a substrate. The second power has a second voltage and a positive or negative polarity with reference to the substrate. The controller is configured to: control the polarity of the first power; control the voltage of the first power; control the polarity of the second power; and/or control the voltage of the second power.

Additional embodiments of the disclosure are directed to a method of chucking a substrate. The method comprises placing a first substrate comprising a monopolar material or a bipolar material in proximity to an electrostatic chuck of some embodiments. When the first power and the second power have matching polarities the first substrate comprises a monopolar material and when the first power and the second power have opposite polarities the first substrate comprises a bipolar material. The electrostatic chuck is activated to chuck the first substrate to the electrostatic chuck. The first substrate is dechucked from the electrostatic chuck. A second substrate comprising a monopolar material or a bipolar material is placed in proximity to the electrostatic chuck. When the first substrate comprises a monopolar material, the second substrate comprises a bipolar material or vice versa. The polarity of the first power source or the second power source is switched. The electrostatic chuck is activated to chuck the second substrate to the electrostatic chuck.

Further embodiments of the disclosure are directed to a computer readable medium including instructions, that, when executed by a controller of an electrostatic chuck, cause the electrostatic chuck to perform the operations of: supplying a first power to a first electrode, the first power having a first polarity and a first voltage; supplying a second power to a second electrode, the second power having a second polarity and a second voltage; and modifying the first polarity and the second polarity based on the material to be chucked.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise.

A "substrate" as used herein, refers to any substrate or material surface formed on a substrate upon which processing is performed. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive or non-conductive materials, depending on the application.

Embodiments of the present disclosure relate to apparatus, methods and controllers for chucking and dechucking substrates of varying materials. Some embodiments of the disclosure advantageously provide electrostatic chucks which can be easily changed between monopolar and bipolar configurations. In some embodiments, the electrostatic chuck is able to chuck/dechuck both monopolar and bipolar materials.

Some embodiments of the disclosure advantageously provide independently reversible power supplies. In some embodiments, each power supply is connected to an electrode. If the polarity of the power supplied to each electrode is the same, the electrostatic chuck operates as a monopolar electrostatic chuck. If the polarity of the power supplied to each electrode is different, the electrostatic chuck operates as a bipolar electrostatic chuck.

Some embodiments of the disclosure advantageously provide a center-tap feedback. Without being bound by theory, it is believed that the use of plasma or other processing methods may bias the substrate relative to the electrostatic chuck. In some embodiments, the center-tap feedback measures any bias on the substrate relative to the electrostatic chuck. The voltages supplied to each electrode (particularly in a bipolar electrostatic chuck) may be offset to provide approximately the same chucking force at each electrode.

Figure 1:
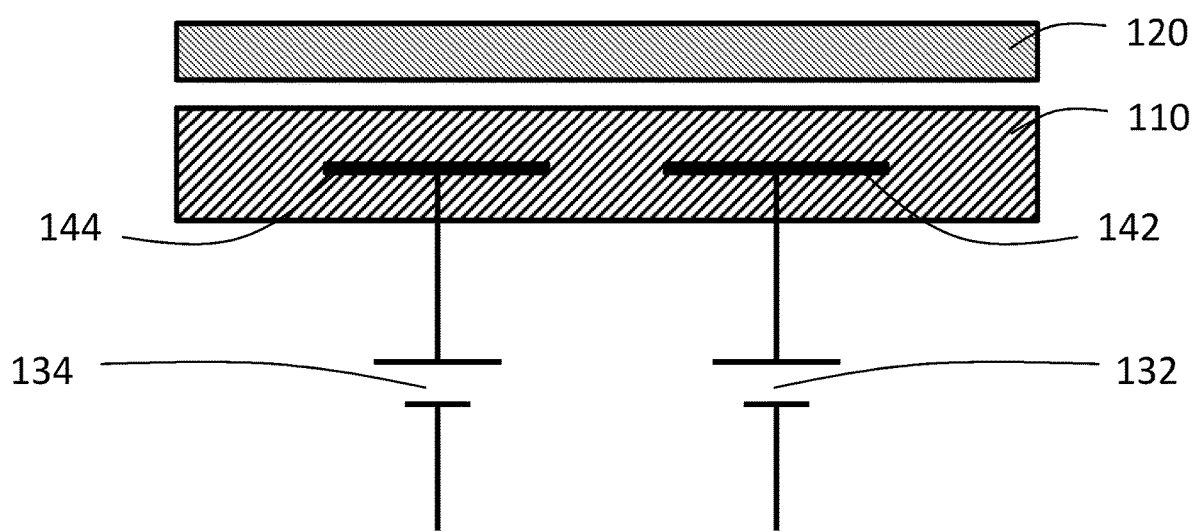
FIG. 1 illustrates an exemplary diagram for a monopolar electrostatic chuck according to one or more embodiment of the disclosure.

Referring to FIG. 1, an exemplary diagram for a monopolar electrostatic chuck 110 is shown. The electrostatic chuck 110 keeps the substrate 120 in a fixed position relative to the electrostatic chuck. The substrate 120 comprises a monopolar material. As used in this regard, a "monopolar material" is any material capable of being held in a fixed position by a monopolar electrostatic chuck.

The electrostatic chuck shown in FIG. 1 comprises a first electrode 142 and a second electrode 144. One skilled in the art will understand that not all monopolar electrostatic chucks require two electrodes. Yet, in some embodiments of this disclosure, the electrostatic chuck comprises at least two electrodes.

The first electrode 142 is powered by a first power source 132. The first power source 132 supplies a first power with a first polarity and a first voltage to the first electrode 142. Similarly, the second electrode 144 is powered by a second power source 134. The second power source 134 supplies a second power with a second polarity and a second voltage to the second electrode 144.

As discussed further below, in contrast to FIG. 2, for a monopolar electrostatic chuck, the first polarity and the second polarity are the same. While a positive polarity at the electrode is shown in FIG. 1, either a positive or negative polarity is within the scope of the disclosure. In some embodiments, the first voltage and the second voltage are also about the same.

Figure 2:
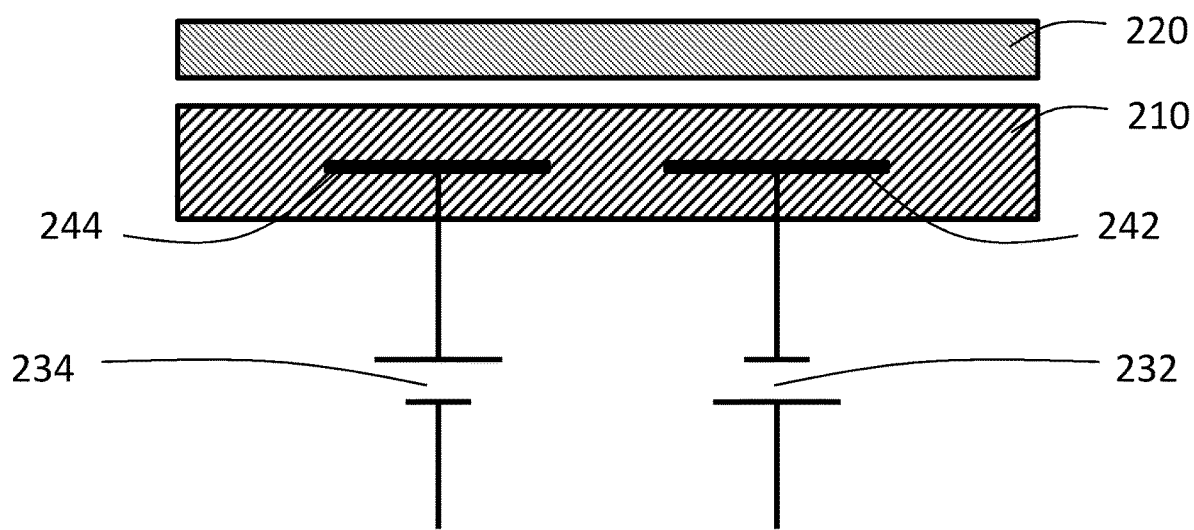
FIG. 2 illustrates an exemplary diagram for a bipolar electrostatic chuck according to one or more embodiment of the disclosure.

Referring to FIG. 2, an exemplary diagram for a bipolar electrostatic chuck 210 is shown. The electrostatic chuck 210 keeps the substrate 220 in a fixed position relative to the electrostatic chuck 210. The substrate 220 comprises a bipolar material. As used in this regard, a "bipolar material" is any material capable of being held in a fixed position by a bipolar electrostatic chuck.

Without being bound by theory, it is believed that many materials are either monopolar materials or bipolar materials. Some materials may be able to be processed by both monopolar and bipolar electrostatic chucks, but these materials are believed to be few. Regardless of the ability to be processed by either electrostatic chuck type, it is believed that all materials demonstrate an ease of processing which favors either monopolar or bipolar electrostatic chucks.

The electrostatic chuck shown in FIG. 2 comprises a first electrode 242 and a second electrode 244. In some embodiments, the electrostatic chuck 210 comprises at least two electrodes.

The first electrode 242 is powered by a first power source 232. The first power source 232 supplies a first power with a first polarity and a first voltage to the first electrode 242. Similarly, the second electrode 244 is powered by a second power source 234. The second power source 234 supplies a second power with a second polarity and a second voltage to the second electrode 244.

As discussed above, for a bipolar electrostatic chuck, the first polarity and the second polarity are different. While a positive polarity at the second electrode 244 with a negative polarity at the first electrode 242 is shown in FIG. 2, the opposite polarities are also within the scope of the disclosure. In some embodiments, the first voltage and the second voltage are also about the same.

Figure 3:
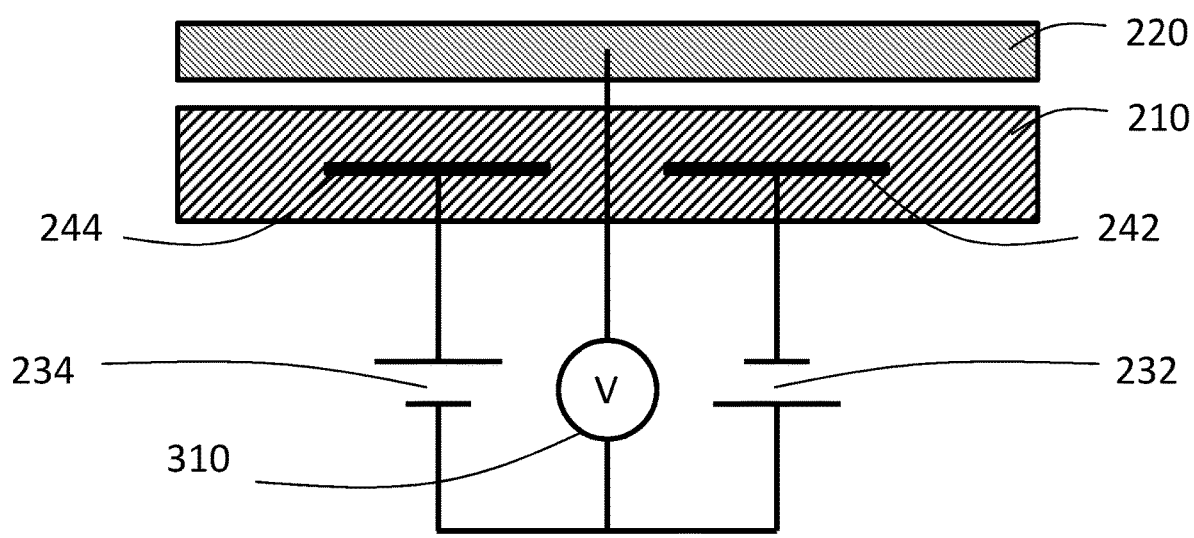
FIG. 3 illustrates an exemplary diagram for an electrostatic chuck comprising a center-tap voltage feedback according to one or more embodiment of the disclosure.

FIG. 3 illustrates a bipolar electrostatic chuck similar to FIG. 2. In FIG. 3, a center-tap voltage feedback 310 has been added. The center-tap voltage feedback 310 measures any bias present on the substrate 220.

In some embodiments, the center-tap voltage feedback 310 is positioned on the substrate 220 between the regions above the first electrode 242 and the second electrode 244. Without being bound by theory, it is believed that in positioning the center-tap voltage feedback 310 between the first electrode 242 and the second electrode 244 the impact, if any, of the first power and the second power on the reading of the center-tap voltage feedback 310 will be minimized.

In some embodiments, when the electrostatic chuck is operating as a bipolar electrostatic chuck, the center-tap voltage feedback 310 is referenced to a common ground of the first power source 232 and the second power source 234. In some embodiments, when the electrostatic chuck is operating as a monopolar electrostatic chuck, the center-tap voltage feedback 310 is isolated from the first power source 232 and the second power source 234.

A bias may be present on the substrate 220 for any reason. In some embodiments, the use of plasma in the processing space above the substrate 220 biases the substrate 220.

In some embodiments, the output of the center-tap voltage feedback 310 is used to adjust the first power and the second power in order to maintain about the same chucking force at each electrode.

Chucking force is proportional to voltage. Accordingly, if a substrate has no bias, about the same chucking force is supplied at each electrode by supplying about the same voltage. For a bipolar electrostatic chuck, the first power and the second power will have opposite polarity but about the same voltage. For example, a first power of +150 V and a second power of −150V would be expected to provide about the same chucking power at each electrode.

But when the substrate is biased, the bias will unevenly affect the voltage and therefore chucking force at each electrode. For example, if the previous example has the substrate biased with −30V, the first power would be equivalent to +120V while the second power would be equivalent to −180 V. In some embodiments, the first power and the second power may be controlled independently to counteract any substrate bias. To continue the above example, the first power may be adjusted to +180V and the second power adjusted to −120V. Accordingly, the effective voltage at each electrode would be +150V and −150V, respectively.

Some embodiments of the disclosure provide an electrostatic chuck comprising a first electrode and a second electrode. The first electrode is powered by a first power supply with a first power. The first power has a first voltage and a positive or negative polarity. The second electrode is powered by a second power supply with a second power. The second power has a second voltage and a positive or negative polarity.

The first power source and the second power source are independently controllable. In some embodiments, the polarity of the first power and/or the second power may be controlled. In some embodiments, the polarity of the first power and the second power are the same. In these embodiments, the electrostatic chuck operates as a monopolar electrostatic chuck. In some embodiments, the polarity of the first power and the second power are different. In these embodiments, the electrostatic chuck operates as a bipolar electrostatic chuck.

In some embodiments, the first voltage and/or the second voltage may be controlled. In some embodiments, the first voltage and the second voltage are about the same. In some embodiments, the first voltage and the second voltage are less than or equal to about 3 kV.

The electrostatic chuck of some embodiments may operate as a monopolar and bipolar electrostatic chuck depending on the polarity of the first power and second power. In this way, the electrostatic chuck of some embodiments is able to process substrates comprising monopolar materials and bipolar materials.

In some embodiments, the electrostatic chuck comprises a center-tap voltage feedback. In some embodiments, the center-tap voltage feedback comprises an RF filter. In some embodiments, the first power source and/o second power source comprises an RF filter. In some embodiments, the RF filter is common to the center-tap voltage feedback, the first power source and the second power source. In some embodiments, the RF filter operates at one or more of 13.56 MHz, 40 MHz or 60 MHz.

Figure 4:
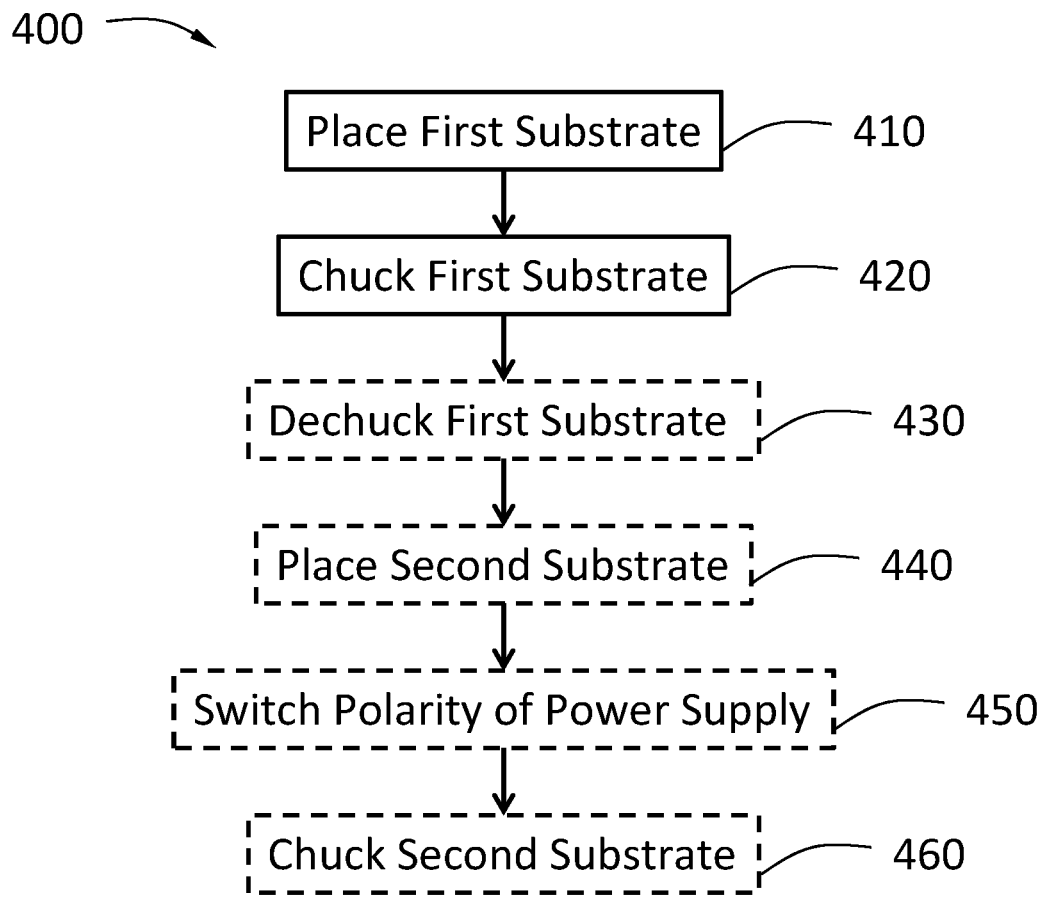
FIG. 4 illustrates a processing method according to one or more embodiments of the disclosure.

Some embodiments of the disclosure relate to methods for operating an electrostatic chuck of some embodiments. Referring to FIG. 4, a method 400 of the disclosure begins at 410 by placing a first substrate in proximity to an electrostatic chuck. The first substrate comprises a monopolar material or a bipolar material. The electrostatic chuck is described above with a first power source and a second power source to supply a first power and a second power to a first electrode and a second electrode, respectively.

The method 400 continues at 420 by activating the electrostatic chuck to chuck the first substrate to the electrostatic chuck. As described above, when the first substrate comprises a monopolar material the first power and the second power have matching polarities and the electrostatic chuck operates as a monopolar chuck. Alternatively, if the first substrate comprises a bipolar material, the first power and the second power have opposite polarities and the electrostatic chuck operates as a bipolar chuck.

In this way, the electrostatic chuck of some embodiments can be used to chuck a first substrate of either monopolar material or bipolar material. Some apparatus and methods of this disclosure can chuck either substrates comprising monopolar materials or substrates comprising bipolar materials without requiring any physical changes to the electrostatic chuck.

In some embodiments, the method 400 continues at 430 by dechucking the first substrate. At 440, a second substrate is placed in proximity to the electrostatic chuck. If the first substrate comprised a monopolar material, the second substrate comprises a bipolar material, or vice versa. At 450, the polarity of the first power source or the second power source is switched. One skilled in the art will recognize that steps 440 and 450 may be performed in any order. The method 400 continues at 460 by activating the electrostatic chuck to chuck the second substrate to the electrostatic chuck.

In this way, the electrostatic chuck of some embodiments can be used to chuck substrates comprising monopolar materials and substrates comprising bipolar materials. Some apparatus and methods of this disclosure can chuck both substrates comprising monopolar materials and substrates comprising bipolar materials without requiring any physical changes to the electrostatic chuck.

Figure 5:
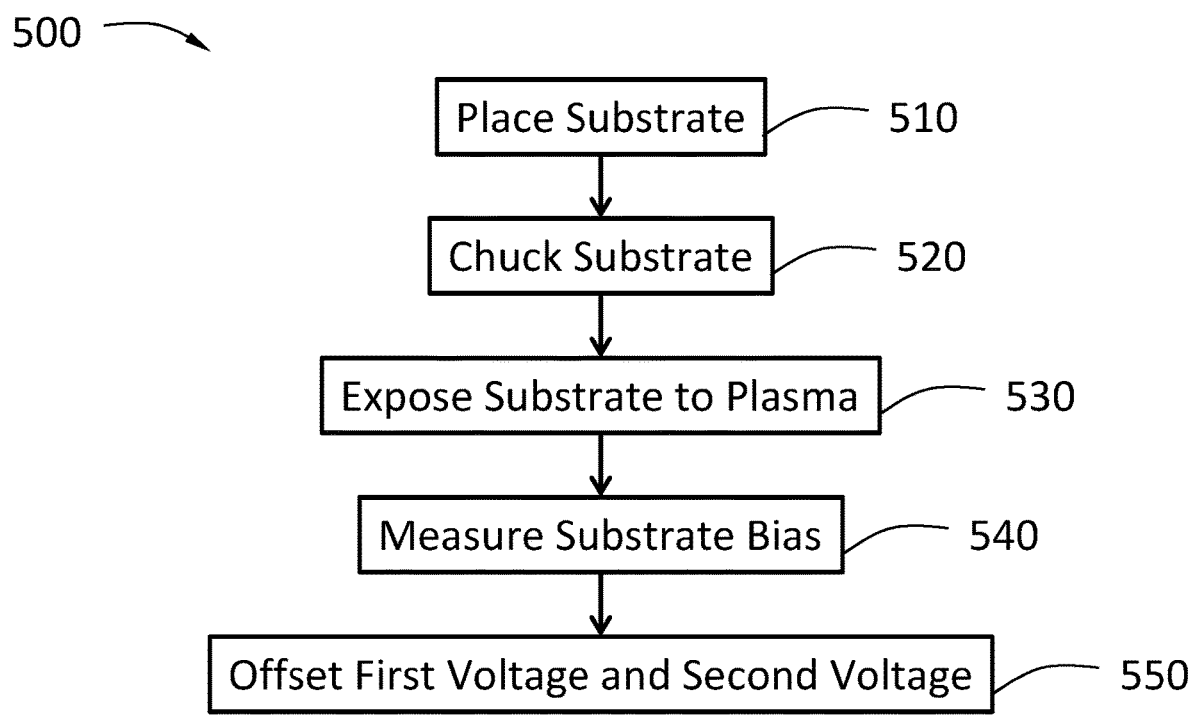
FIG. 5 illustrates a processing method according to one or more embodiments of the disclosure.

Referring to FIG. 5, another method 500 of the disclosure begins at 510 by placing a substrate in proximity to an electrostatic chuck. The electrostatic chuck comprises a bipolar electrostatic chuck and a center-tap voltage feedback. At 520, the electrostatic chuck is activated to chuck the substrate. At 530, the substrate is exposed to a plasma. After being exposed to the plasma, the substrate develops a bias relative to the electrostatic chuck. At 540, the bias between the substrate and the electrostatic chuck is measured to provide a C-T voltage. Finally, at 550, the first voltage and the second voltage are offset by the C-T voltage.

In some embodiments, the center-tap voltage feedback is operated intermittently. In some embodiments, the electrostatic chuck comprises gates or switches to enable and disable the center-tap voltage feedback. Without being bound by theory, it is believed that isolating the C-T voltage may require operating the center-tap voltage feedback intermittently rather than continuously.

Some embodiments of the disclosure relate to a general electrostatic chuck for performing the disclosed methods. In some embodiments, the electrostatic chuck comprises at least one controller coupled to one or more of the first power supply, the second power supply, or center-tap voltage feedback. In some embodiments, there are more than one controller connected to the individual components and a primary control processor is coupled to each of the separate controller or processors to control the electrostatic chuck. The controller may be one of any form of general-purpose computer processor, microcontroller, microprocessor, etc., that can be used in an industrial setting for controlling various elements and/or sub-processors.

The at least one controller can have a processor, a memory coupled to the processor, input/output devices coupled to the processor, and support circuits to communicate between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the electrostatic chuck. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the electrostatic chuck to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the electrostatic chuck operation such that the disclosed processes are performed.

In some embodiments, the controller has one or more configurations to execute individual processes or sub-processes to perform the disclosed methods. The controller can be connected to and configured to operate intermediate components to perform the functions of the methods. For example, the controller can be connected to and configured to control one or more of gas valves, actuators, power sources, heaters, vacuum control, etc.

The controller or non-transitory computer readable medium of some embodiments has one or more configurations selected from: a configuration to control the polarity of the first power; a configuration to control the voltage of the first power; a configuration to control the polarity of the second power; a configuration to control the voltage of the second power; a configuration to measure bias on a substrate relative to the electrostatic chuck; a configuration to active/deactivate the center-tap voltage feedback; a configuration to balance the chucking force at the first electrode and the second electrode; and/or a configuration to chuck/dechuck a substrate.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. An electrostatic chuck comprising:
   a first electrode powered by a first power supply with a first power, the first power having a first voltage and a positive or negative polarity with reference to a substrate;
   a second electrode powered by a second power supply with a second power, the second power having a second voltage and a positive or negative polarity with reference to the substrate;
   a center-tap voltage feedback; and
   a controller connected to the first power supply, the second power supply, and the center-tap voltage feedback, the controller configured to control one or more of the polarity of the first power; the first voltage; the polarity of the second power; or the second voltage, and to balance the first voltage and the second voltage with reference to the substrate.

2. The electrostatic chuck of claim 1, wherein the first voltage and the second voltage are less than or equal to about 3 kV.

3. The electrostatic chuck of claim 1, wherein the polarity of the first power and the second power are the same.

4. The electrostatic chuck of claim 3, wherein the first voltage and the second voltage are about the same.

5. The electrostatic chuck of claim 1, wherein the polarity of the first power and the second power are different.

6. The electrostatic chuck of claim 1, wherein the polarity of the first power and the second power are the same, and the center-tap voltage feedback is isolated from the first power supply and the second power supply.

7. The electrostatic chuck of claim 1, wherein the polarity of the first power and the second power are different, and the center-tap voltage feedback is referenced to a common ground of the first power supply and the second power supply.

8. The electrostatic chuck of claim 1, wherein the center-tap voltage feedback comprises an RF frequency filter.

9. The electrostatic chuck of claim 8, wherein the RF frequency filter operates at one or more of 13.56 MHz or 60 MHz.

10. A method of chucking a substrate, the method comprising:
    placing a substrate in proximity to an electrostatic chuck, the electrostatic chuck comprising:
       a first electrode powered with a first power by a first power supply, the first power having a first voltage and a positive or negative polarity with reference to the substrate;
       a second electrode powered with a second power by a second power supply, the second power having a second voltage and a positive or negative polarity with reference to the substrate opposite of the polarity of the first power; and
       a center-tap voltage feedback; and
    activating the electrostatic chuck;
    exposing the substrate to a plasma;
    measuring a bias between the substrate and the electrostatic chuck to provide a C-T voltage; and
    offsetting the first voltage and the second voltage by the C-T voltage to balance a chucking force of the first electrode and the second electrode.

11. The method of claim 10, wherein the center-tap voltage feedback comprises an RF frequency filter.

12. The method of claim 11, wherein the RF frequency filter operates at one or more of 13.56 MHz or 60 MHz.

13. The method of claim 10, wherein the center-tap voltage feedback is operated intermittently.

14. The method of claim 10, wherein the polarity of the first power and the second power are the same and the center-tap voltage feedback is isolated from the first power supply and the second power supply.

15. The method of claim 10, wherein the polarity of the first power and the second power are the same and the first voltage and the second voltage are about the same.

16. The method of claim 10, wherein the polarity of the first power and the second power are different, and the center-tap voltage feedback is referenced to a common ground of the first power supply and the second power supply.

17. A method of chucking a substrate, the method comprising:

placing a first substrate comprising a monopolar material or a bipolar material in proximity to an electrostatic chuck, the electrostatic chuck comprising:
  a first electrode powered with a first power by a first power supply, the first power having a first voltage and a positive or negative polarity with reference to a substrate; and
  a second electrode powered with a second power by a second power supply, the second power having a second voltage and a positive or negative polarity with reference to the substrate; and
activating the electrostatic chuck;
dechucking the first substrate;
placing a second substrate comprising a monopolar material or a bipolar material different from the first substrate in proximity to the electrostatic chuck;
switching the polarity of the first power supply or the second power supply; and
activating the electrostatic chuck,
wherein when the first power and the second power have matching polarities the first substrate comprises a monopolar material and when the first power and the second power have opposite polarities the first substrate comprises a bipolar material.

18. The method of claim 17, wherein when the first substrate comprises a monopolar material, the first voltage and the second voltage are about the same.

* * * * *